United States Patent
Naeve

(10) Patent No.: US 11,646,252 B2
(45) Date of Patent: May 9, 2023

(54) SEMICONDUCTOR DEVICE INCLUDING AN EXTENSION ELEMENT FOR AIR COOLING

(71) Applicant: Infineon Technologies AG, Neubiberg (DE)

(72) Inventor: Tomasz Naeve, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/165,599

(22) Filed: Feb. 2, 2021

(65) Prior Publication Data

US 2021/0242114 A1 Aug. 5, 2021

(30) Foreign Application Priority Data

Feb. 3, 2020 (DE) .......................... 102020102653.6

(51) Int. Cl.
*H01L 23/495* (2006.01)
*H01L 21/48* (2006.01)

(52) U.S. Cl.
CPC .... *H01L 23/49568* (2013.01); *H01L 21/4825* (2013.01); *H01L 21/4842* (2013.01); *H01L 23/49503* (2013.01)

(58) Field of Classification Search
CPC . H01L 21/4825; H01L 21/4842; H01L 21/50; H01L 23/49568; H01L 23/49503; H01L 23/4334; H01L 23/49562; H01L 23/495; H01L 23/367
See application file for complete search history.

(56) References Cited

U.S. PATENT DOCUMENTS

| 5,375,039 A | 12/1994 | Wiesa |
| 2007/0215999 A1* | 9/2007 | Kashimoto ............. H01L 24/49 257/E21.504 |
| 2008/0054417 A1 | 3/2008 | Lee et al. |
| 2009/0001535 A1 | 1/2009 | Heng et al. |
| 2009/0057878 A1 | 3/2009 | Gomez |
| 2013/0049077 A1 | 2/2013 | Herbsommer et al. |
| 2014/0353766 A1* | 12/2014 | Tan ........................ H01L 23/492 438/126 |
| 2015/0348864 A1* | 12/2015 | Tan ..................... H01L 29/7395 257/329 |
| 2019/0101123 A1 | 4/2019 | Matsumura et al. |

FOREIGN PATENT DOCUMENTS

| CN | 205883832 U | 1/2017 |
| DE | 102015100238 A1 | 7/2015 |
| DE | 102015108479 A1 | 12/2015 |

* cited by examiner

*Primary Examiner* — Andres Munoz
(74) *Attorney, Agent, or Firm* — Murphy, Bilak & Homiller, PLLC

(57) ABSTRACT

A semiconductor device includes a semiconductor chip, a connection element configured to mechanically and electrically couple the semiconductor device to a circuit board, wherein the connection element is electrically coupled to the semiconductor chip and arranged in a mounting plane of the semiconductor device, and the semiconductor chip is mounted on the connection element. The semiconductor device further includes an extension element mechanically coupled to the connection element and extending in a direction out of the mounting plane, wherein the extension element is configured for air cooling.

15 Claims, 4 Drawing Sheets

SEMICONDUCTOR DEVICE INCLUDING AN EXTENSION ELEMENT FOR AIR COOLING

RELATED APPLICATIONS

This application claims priority from German patent application DE 102020102653.6 filed on Feb. 3, 2020, the contents of which are incorporated by reference herein in its entirety.

TECHNICAL FIELD

The present disclosure generally relates to semiconductor technology. In particular, the present disclosure relates to semiconductor devices including an extension element for air cooling. The present disclosure further relates to methods for manufacturing such semiconductor devices.

BACKGROUND

The cooling of semiconductor devices may have an effect on the cost-performance ratio of the devices. For example, the cooling of a semiconductor device may be provided via the circuit board on which the device is mounted. In other applications, a fan may provide an air cooling of a semiconductor device. Manufacturers of semiconductor devices are constantly striving to improve their products and methods for manufacturing thereof. It may be desirable to develop semiconductor devices with an improved cost-performance ratio and methods for manufacturing such semiconductor devices. In particular, it may be desirable to provide improved cooling solutions for semiconductor devices.

SUMMARY

An aspect of the present disclosure relates to a semiconductor device. The semiconductor device includes a semiconductor chip. The semiconductor device further includes a connection element configured to mechanically and electrically couple the semiconductor device to a circuit board, wherein the connection element is electrically coupled to the semiconductor chip and arranged in a mounting plane of the semiconductor device, and wherein the semiconductor chip is mounted on the connection element. The semiconductor device further includes an extension element mechanically coupled to the connection element and extending in a direction out of the mounting plane, wherein the extension element is configured for air cooling.

An aspect of the present disclosure relates to a method for manufacturing a semiconductor device. The method includes providing a semiconductor chip. The method further includes providing a connection element configured to mechanically and electrically couple the semiconductor device to a circuit board, wherein the connection element is electrically coupled to the semiconductor chip and arranged in a mounting plane of the semiconductor device, and wherein the semiconductor chip is mounted on the connection element. The method further includes providing an extension element mechanically coupled to the connection element and extending in a direction out of the mounting plane, wherein the extension element is configured for air cooling.

Of course, the present invention is not limited to the above features and advantages. Those of ordinary skill in the art will recognize additional features and advantages upon reading the following detailed description, and upon viewing the accompanying drawings.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense.

Figure 1:
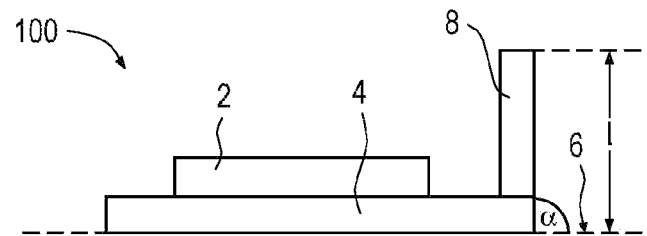
FIG. 1 schematically illustrates a cross-sectional side view of a semiconductor device 100 in accordance with the disclosure.

The semiconductor device 100 of FIG. 1 is illustrated in a general manner in order to qualitatively specify aspects of the disclosure. The semiconductor device 100 may include further aspects which are not illustrated for the sake of simplicity. For example, the semiconductor device 100 may be extended by any of the aspects described in connection with other semiconductor devices and methods in accordance with the disclosure.

The semiconductor device 100 may include a semiconductor chip 2 and a connection element 4. The connection element 4 may be configured to mechanically and electrically couple the semiconductor device 100 to a circuit board (not illustrated). The connection element 4 may be electrically coupled to the semiconductor chip 2 and may be arranged in a mounting plane 6 of the semiconductor device 100. In the example of FIG. 1, the mounting plane 6 and the bottom surface of the connection element 4 may be arranged in the x-y-plane. The semiconductor chip 2 may be mounted on the connection element 4. The semiconductor device 100 may further include an extension element 8 mechanically coupled to the connection element 4 and extending in a direction out of the mounting plane 6. The extension element 8 may be configured for air cooling.

The semiconductor chip 2 may generally include integrated circuits, passive electronic components, active electronic components, etc. The integrated circuits may be designed as logic integrated circuits, analog integrated circuits, mixed signal integrated circuits, power integrated circuits, etc. In one example, the semiconductor chip 2 may be manufactured from an elemental semiconductor material (e.g. Si). In a further example, the semiconductor chip 2 may be manufactured from a wide band gap semiconductor material or a compound semiconductor material (e.g. SiC, GaN, SiGe, GaAs). In particular, the semiconductor chip 2 may include a power semiconductor. Such semiconductor chip 2 may be used in any kind of power application like e.g. MOSFETs (Metal Oxide Semiconductor Field Effect Transistors), half bridge circuits, power modules including a gate driver, etc. For example, the semiconductor chip 2 may include or may be part of a power device like e.g. a power MOSFET, an LV (low voltage) power MOSFET, a power IGBT (Insulated Gate Bipolar Transistor), a power diode, a superjunction power MOSFET, etc. A power semiconductor element may e.g. have a supply voltage of more than about 20V.

The semiconductor chip 2 may have a vertical structure, i.e. the semiconductor chip 2 may be fabricated such that electric currents may substantially flow in a direction perpendicular to the main faces of the semiconductor chip 2. A semiconductor chip 2 having a vertical structure may have electrodes over its two main faces, i.e. over its top side and bottom side. In particular, power semiconductor chips may have a vertical structure and may have load electrodes arranged over both main faces. For example, the source electrode and gate electrode of a power MOSFET may be arranged over one face while the drain electrode of the power MOSFET may be arranged over the other face. In a further example, a power HEMT may be configured as a vertical power semiconductor chip. Yet further examples for a vertical power semiconductor chip are a PMOS (P-Channel Metal Oxide semiconductor) or an NMOS (N-Channel Metal Oxide semiconductor).

In one example, the connection element 4 and/or the extension element 8 may be part of a leadframe of the semiconductor device 100. The leadframe may be structured such that diepads and leads (or pins) may be formed. A diepad may be configured as a carrier for one or more semiconductor chips. Each of a diepad and a lead may be configured to provide an electrical connection to a semiconductor chip. Accordingly, in one example, the connection element 4 may be a diepad on which the semiconductor chip 2 may be mounted, while in a further example, the connection element 4 may be a lead. During a fabrication of a semiconductor device, the diepads and the leads may be connected to each other. The diepads and the leads may be made from one piece. The diepads and the leads may be connected among each other by connection means with the purpose of separating some of the diepads and the leads in the course of the fabrication. Separating the diepads and the leads may be carried out by at least one of mechanical sawing, a laser beam, cutting, stamping, milling, etching, etc. The leadframe may be fabricated from metals and/or metal alloys, in particular at least one of copper, copper alloys, nickel, iron nickel, aluminum, aluminum alloys, steel, stainless steel, etc.

The connection element 4 and the extension element 8 may be fabricated as an integral single piece from the very beginning. That is, the two elements 4, 8 may be not available as two separate pieces at any time. A mechanical connection between the two elements 4, 8 thus may be inherent to and a consequence of their fabrication process. For example, the connection element 4 and the extension element 8 may be formed from a continuous single part of a leadframe and may thus be made of a similar material. In one example, the connection element 4 and the extension element 8 may be formed from a diepad of a leadframe. The diepad may be bent such that a first part of the diepad may form the connection element 4 arranged in the mounting plane 6, and a second part of the diepad may form the extension element 8 extending in a direction out of the mounting plane 6. In a further example, the connection element 4 and the extension element 8 may be formed from a lead of a leadframe. The lead may be bent such that a first part of the lead may form a connection element which may at least partly be arranged in a mounting plane, and a second part of the lead may form an extension element extending in a direction out of the mounting plane.

The connection element 4 and the extension element 8 may first be provided as two separate pieces that may be joint together afterwards. For example, the connection element 4 may be a part of a leadframe, such as e.g. a diepad or a lead, and the extension element 8 may be a component made of a metal and/or a metal alloy. The extension element 8 may then be mechanically connected to the connection element 4 by means of an appropriate technique, such as e.g. applying a soldering act. In one example, a material of the connection element 4 may be similar to a material of the extension element 8. In a further example, the elements 4, 8 may be made of different materials.

A length "l" of the extension element 8 along the direction out of the mounting plane 6 may be smaller than about 8.0 mm, more particular smaller than about 7.5 mm, more particular smaller than about 7.0 mm, more particular smaller than about 6.5 mm, more particular smaller than about 6.0 mm, more particular smaller than about 5.5 mm, and even more particular smaller than about 5.0 mm. In addition, the length "l" may be greater than about 1.0 mm, more particular greater than about 1.5 mm, more particular greater than about 2.0 mm, more particular greater than about 2.5 mm, more particular greater than about 3.0 mm, more particular greater than about 3.5 mm, and even more particular greater than about 4.0 mm. In FIG. 1, the length "l" may be measured in the z-direction, i.e. substantially perpendicular to the mounting plane 6. In one example, the length "l" may be limited by a maximum overall height of the semiconductor device 100 in the z-direction. In a further example, the length "l" may be limited by a width of a leadframe strip from which the extension element 8 may be fabricated. An example for a leadframe strip for fabricating a semiconductor device in accordance with the disclosure is shown and discussed in FIGS. 6 and 7.

In the example of FIG. 1, the extension element 8 may extend in a direction substantially perpendicular to the mounting plane 6. That is, an angle α between the extension element 8 and the mounting plane 6 may have a value of about 90 degrees. More general, the angle α may be greater than about 20 degrees, more particular greater than about 30 degrees, more particular greater than about 40 degrees, more particular greater than about 50 degrees, more particular greater than about 60 degrees, more particular greater than about 70 degrees, and even more particular greater than about 80 degrees.

The extension element 8 may be configured for air cooling. Accordingly, the extension element 8 may be at least partly in direct contact with air or an ambient gas surrounding the extension element 8 and the semiconductor device 100. For example, the semiconductor device 100 may include an encapsulation material (not illustrated) at least partly encapsulating the semiconductor chip 2. In this case, the extension element 8 may at least partly protrude out of the encapsulation material such that air cooling becomes possible. An interface between the material of the extension element 8 and the air or ambient gas may provide a dissipation of heat generated by the semiconductor chip 2 into the environment. Compared to semiconductor devices without extension element, the semiconductor device 100 may provide an increased dissipation of thermal energy into the environment. A cooling and cost-performance ratio of the semiconductor device 100 may thus be improved.

The semiconductor device 200 of FIG. 2 may be seen as a more detailed implementation of the semiconductor device 100 of FIG. 1. Comments made in connection with FIG. 2 may thus also hold true for FIG. 1 and vice versa. The semiconductor device 200 may include a leadframe with a diepad 10 and multiple leads 12. A semiconductor chip 2 may be arranged over an upper surface of the diepad 10. The semiconductor device 200 may further include an encapsulation material 14 and an extension element 8 formed from the diepad 10.

In the example of FIG. 2, the semiconductor chip 2 may be a transistor including a drain contact 16 arranged on a bottom surface of the semiconductor chip 2 as well as a gate contact 18 and a source contact 20 arranged on an upper surface of the semiconductor chip 2. In particular, the semiconductor chip 2 may have a vertical structure and may include a power semiconductor. The drain contact 16 may be electrically coupled to the diepad 10. For example, the semiconductor chip 2 may be soldered to the diepad 10 or may be attached to the diepad 10 by means of an electrically conductive adhesive. The central one of the leads 12 may be mechanically and/or electrically connected to the diepad 10, in particular in a direct fashion. The diepad 10 and the central lead 12 may be formed as one integral single piece. The central lead 12 may remain without contact to the circuit board. The gate contact 18 may be electrically coupled to a first one of the leads 12 on the very left. The source contact 20 may exemplarily include four electrodes which may be electrically coupled to one or multiple of the remaining leads 12.

Figure 2A:
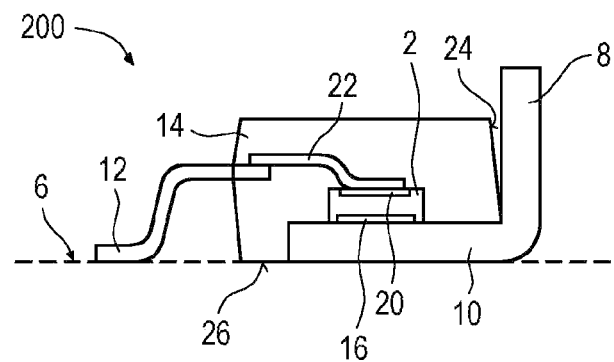
FIG. 2 includes FIGS. 2A and 2B schematically illustrating a cross-sectional side view and a top view of a semiconductor device 200 in accordance with the disclosure.

In the example of FIG. 2, the semiconductor device 200 may include seven leads and may thus be referred to as a 7-pin device. In further examples, the number of leads may however differ from the illustrated example. Further, it is noted that the wiring shown in FIG. 2 is exemplary and by no means limiting. In the example of FIG. 2, the contacts 18, 20 may be electrically connected to the leads 12 via connection elements 22. In general, each of the connection elements 22 may include or correspond to one or more of a bond wire, a clip, or a ribbon. In the example of FIG. 2, the gate contact 18 may be connected to the respective lead 12 via a bond wire, while the electrodes of the source contact 20 may be connected to the respective leads via ribbons or clips. Note that the bond wire 22 connected to the gate contact 18 may be hidden in the side view FIG. 2A.

The encapsulation material 14 may at least partly encapsulate one or more of the semiconductor chip 2, the diepad 10, the leads 12, or the connection elements 22. The diepad 10 and the leads 12 may at least partly protrude out of the encapsulation material 14 such that the contacts 16, 18, 20 of the semiconductor chip 2 may be electrically accessible from outside of the encapsulation material 14. The diepad 10 may protrude out of the encapsulation material 14 at a side surface 24 of the semiconductor device 200. In the example of FIG. 2, a bottom surface of the diepad 10 may be uncovered by the encapsulation material 14. In further examples, the bottom surface of the diepad 10 may be (in particular completely) covered by the encapsulation material 14. In such case, a connection between the diepad 10 and a circuit board may be provided via a portion of the diepad 10 protruding out of the side surface 24. The encapsulation material 14 may include at least one of the following materials: epoxy, filled epoxy, glass fiber filled epoxy, imide, thermoplast, thermoset polymer, polymer blend. In particular, the encapsulation material 14 may be formed from a mold compound.

The semiconductor device 200 may be mechanically and electrically coupled to a circuit board (not illustrated) which may be seen as a part of the semiconductor device 200 or not. Here, a bottom surface 26 of the semiconductor device 200 and an upper surface of the circuit board may substantially lie in the mounting plane 6. In particular, the semiconductor device 200 may be a surface mounted device (SMD). A connection between the semiconductor device 200 and the circuit board may be provided via the diepad 10 and the leads 12. For example, the corresponding connections may be provided by applying a soldering act.

Figure 2B:
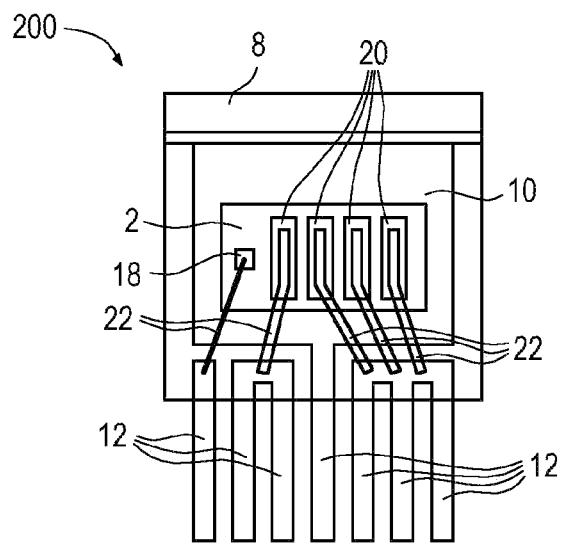

A portion of the diepad 10 of FIG. 2 may correspond to the connection element 4 of FIG. 1 and may be configured to mechanically and electrically couple the semiconductor device 200 to a circuit board. In the example of FIG. 2, the connection element and the extension element 8 may be formed by the diepad 10. The diepad 10 may be bent such that a first portion of the diepad 10 may form the connection element connected to the circuit board, and a second portion of the diepad 10 may form the extension element 8 extending in a direction out of the mounting plane 6. As can be seen from the top view of FIG. 2B, the extension element 8 may extend substantially along an entire side surface of the semiconductor device 200.

During an operation of the semiconductor device 200 heat generated by the semiconductor chip 2 may dissipate along a path from the semiconductor chip 2 via the diepad 10 to the extension element 8. The semiconductor chip 2 may be mounted on the diepad 10 and thus may be in (particularly direct) mechanical contact with the diepad 10. A heat transport from the semiconductor chip 2 to the extension element 8 may be effective due to this mechanical connection. In particular, the semiconductor chip 2 and the extension element 8 may substantially heat up to a same temperature such that thermal energy generated by the semiconductor chip 2 may be effectively dissipated into the environment by an air cooling of the extension element 8.

Figure 3A:
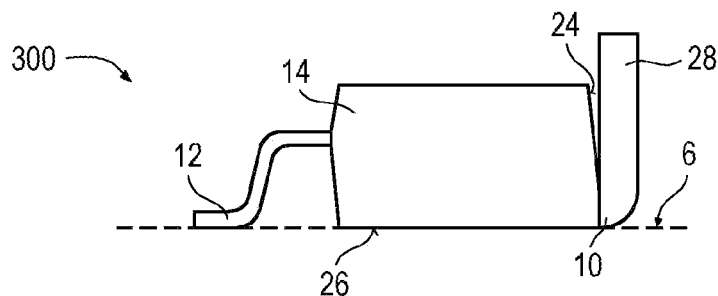
FIG. 3 includes FIGS. 3A and 3B schematically illustrating a side view and a top view of a semiconductor device 300 in accordance with the disclosure.
Figure 3B:
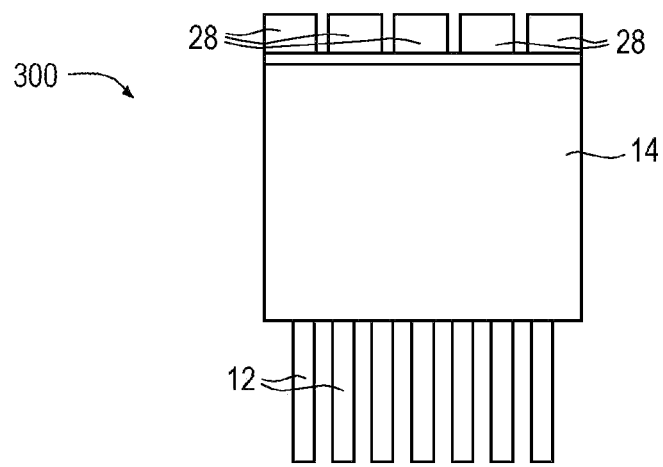

The semiconductor device 300 of FIG. 3 may at least partly be similar to the semiconductor device 200 of FIG. 2. For the sake of simplicity, an internal circuitry of the semiconductor device 300 is not shown. The internal circuitry of the semiconductor device 300 may e.g. be similar to FIG. 2.

In contrast to FIG. 2, an extension element of the semiconductor device 300 may include multiple fingers 28 configured for air cooling. In the example of FIG. 3, the semiconductor device 300 may include five fingers 28. In further examples, the number of fingers 28 may differ. More general, the number of fingers may be greater than two, more particular greater than three, more particular greater than four, more particular greater than five, more particular greater than six, and even more particular greater than seven. For example, the fingers 28 may be arranged in a comb-shape. That is, the fingers 28 may extend in substantially parallel directions. Compared to the extension element 8 of FIG. 2, the fingers 28 of FIG. 3 may provide an increased interface area between the material of the extension element 8 and air or an ambient gas. A dissipation of thermal energy into the environment via air cooling may thus become more effective.

Figure 4A:
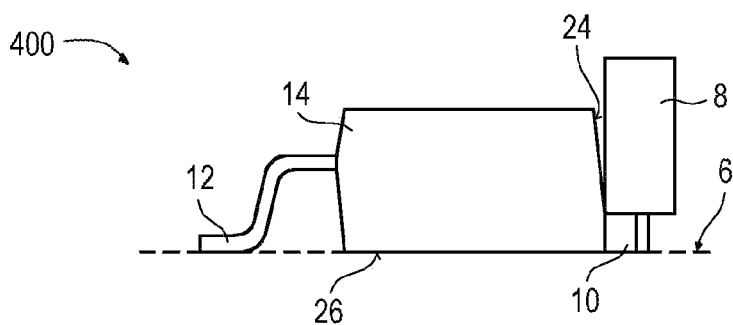
FIG. 4 includes FIGS. 4A and 4B schematically illustrating a side view and a top view of a semiconductor device 400 in accordance with the disclosure.
Figure 4B:
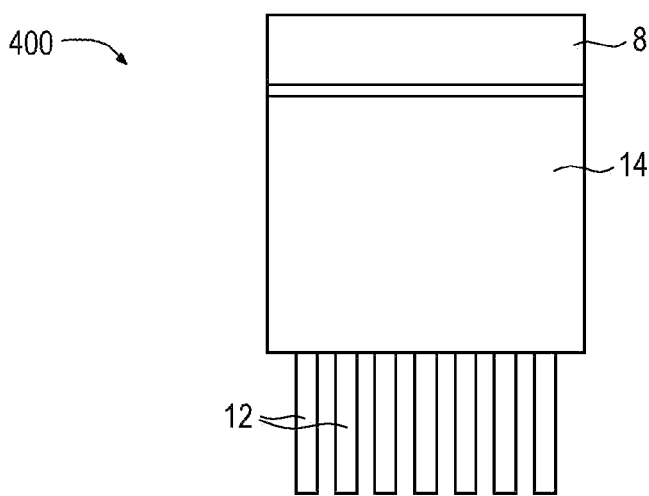

The semiconductor device 400 of FIG. 4 may at least partly be similar to the semiconductor device 200 of FIG. 2. For the sake of simplicity, an internal circuitry of the semiconductor device 400 is not shown. The internal circuitry of the semiconductor device 400 may e.g. be similar to FIG. 2. In contrast to FIG. 2, the diepad 10 and the extension element 8 may not necessarily form one integral single piece. The elements 8, 10 may initially be provided as two separate pieces that are mechanically connected together afterwards. For example, the extension element 8 may be made of one or more of a metal or a metal alloy. The extension element 8 may be mechanically connected to the diepad 10 by means of a soldering act in one example.

Figure 5A:
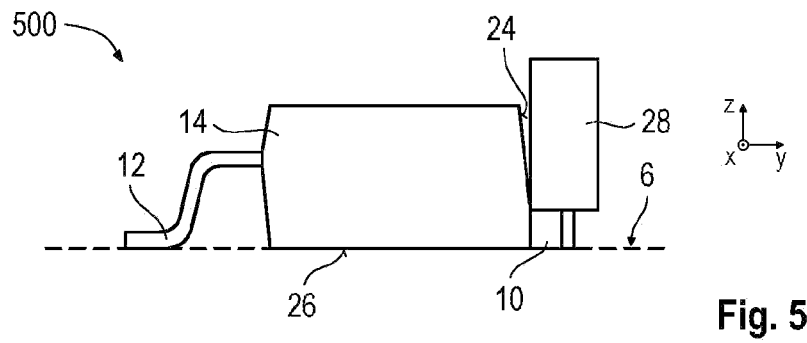
FIG. 5 includes FIGS. 5A and 5B schematically illustrating a side view and a top view of a semiconductor device 500 in accordance with the disclosure.
Figure 5B:
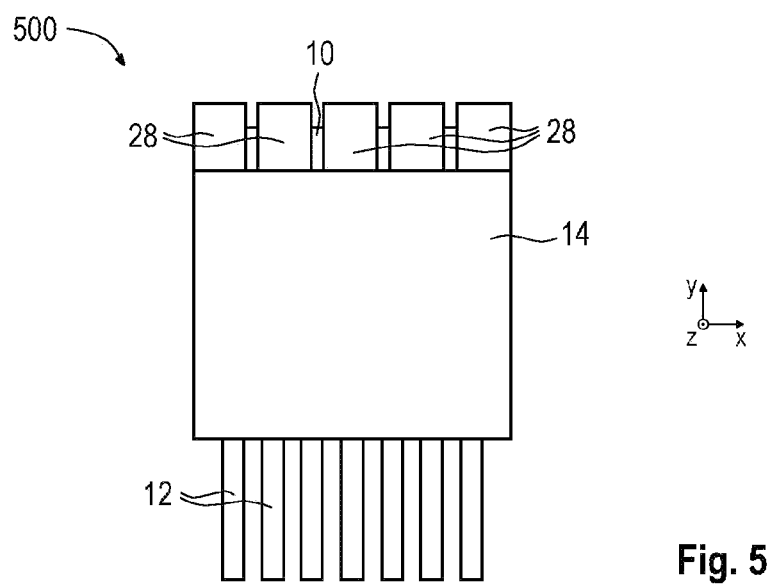

The semiconductor device 500 of FIG. 5 may at least partly be similar to the semiconductor device 300 of FIG. 3. For the sake of simplicity, an internal circuitry of the semiconductor device 500 is not shown. The internal circuitry of the semiconductor device 500 may e.g. be similar to FIG. 2. In contrast to FIG. 3, the diepad 10 and the fingers 28 forming an extension element may not necessarily form one integral single piece. The fingers 28 may first be provided as separate pieces that are mechanically connected to the diepad 10 afterwards. For example, the fingers 28 may be made of one or more of a metal or a metal alloy and may be soldered to the diepad 10.

Figure 6:
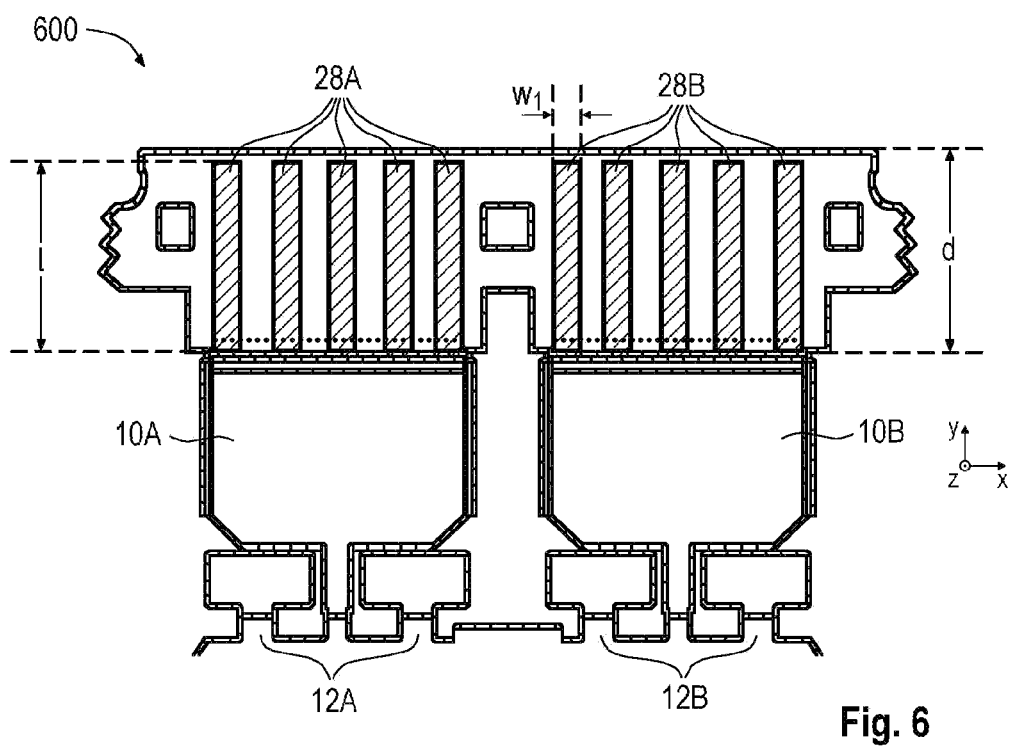
FIG. 6 schematically illustrates a top view of a leadframe strip 600 for manufacturing a semiconductor device in accordance with the disclosure.

The leadframe strip 600 of FIG. 6 may include multiple leadframes forming diepads 10A, 10B and leads 12A, 12B. In the example of FIG. 6, only two leadframes are illustrated for the sake of simplicity. In further examples, the leadframe strip 600 may include a larger number of leadframes, such as e.g. tens or hundreds of leadframes. The diepads 10A, 10B and leads 12A, 12B may be connected among each other with the purpose of separating them during the fabrication process.

Extension elements for air cooling as previously described may be formed from the diepads 10A, 10B and leads 12A, 12B. In particular, the leadframe strip 600 of FIG. 6 may be used to form extension elements including multiple fingers 28A, 28B arranged in a comb-shape (see e.g. FIG. 3). In FIG. 6, the fingers 28 to be manufactured are indicated by hatched areas. For example, the fingers 28 may be formed by applying at least one of mechanical sawing, a laser beam, cutting, stamping, milling, etching, etc. The fingers 28 may be formed from an upper portion of the leadframe strip 600 which may have a dimension "d" in the y-direction. The dimension "d" may lie in an exemplary range from about 6.0 mm to about 7.0 mm. A specific exemplary value of the dimension "d" may be about 6.5 mm. A length "l" of the fingers 28 may be limited by the dimension "d" of the upper portion of the leadframe strip 700. In the example of FIG. 6, the fingers 28A, 28B may be of similar shape having a similar length "l" and a similar width "w1". In further examples, at least two of the fingers 28A, 28B may have different lengths "l" and/or widths "w1". Furthermore, in the example of FIG. 6, the width "w1" of a finger 28 may be substantially constant along the entire length "l" of the finger 28. In a further example, the width "w1" of a finger 28 may vary along the length "l" of the finger 28.

When manufacturing semiconductor devices from the leadframe strip 600, semiconductor chips may be arranged on the diepads 10A, 10B. The semiconductor chips may be electrically connected to the diepads 10A, 10B and the leads 12A, 12B. The components of the arrangement may then be encapsulated by an encapsulation material, for example by applying a molding technique. After performing the encapsulation act, the fingers 28 may be bent out of the x-y-plane forming a comb-shaped extension element as e.g. shown in FIG. 3.

Figure 7:
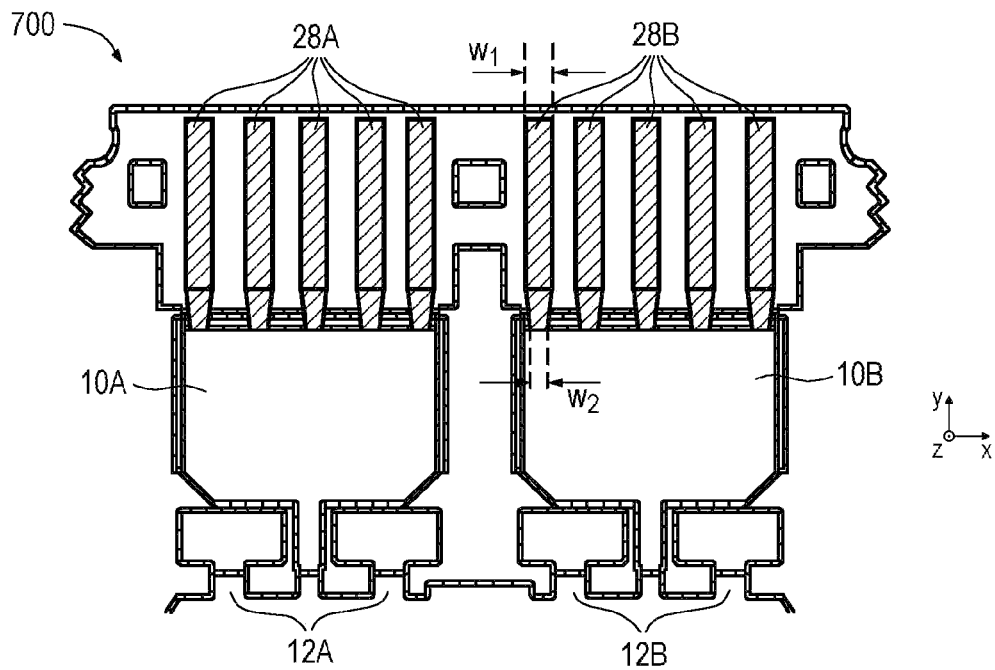
FIG. 7 schematically illustrates a top view of a leadframe strip 700 for manufacturing a semiconductor device in accordance with the disclosure.

The leadframe strip 700 of FIG. 7 may at least partly be similar to the leadframe strip 600 of FIG. 6. In contrast to FIG. 6, one or more of the fingers 28A, 28B may taper in a direction towards the diepads 12A, 12B. That is, a width of a finger 28 may reduce in a direction towards the respective diepad 10. In the example of FIG. 7, a first width "w1" of a first portion of the finger 28 spaced apart from the diepad 10 may be greater than a second width "w2" of a second portion of the finger 28 arranged closer to the diepad 10. In particular, the thinner portion of a finger 28 may be in mechanical contact with the diepad 10. A reduced finger width may require less force to bend the finger 28 in a direction out of the mounting plane.

Figure 8:
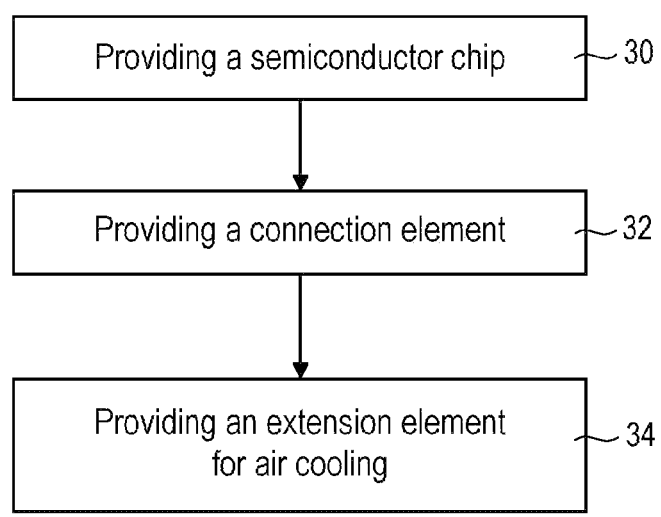
FIG. 8 illustrates a flowchart of a method for manufacturing a semiconductor device in accordance with the disclosure.

FIG. 8 illustrates a flowchart of a method for manufacturing a semiconductor device in accordance with the disclosure. The method may be used for fabricating any of the described semiconductor devices in accordance with the disclosure.

At 30, a semiconductor chip may be provided. At 32, a connection element may be provided. The connection element may be configured to mechanically and electrically couple the semiconductor device to a circuit board, wherein the connection element is electrically coupled to the semiconductor chip and arranged in a mounting plane of the semiconductor device, and wherein the semiconductor chip is mounted on the connection element. At 34, an extension element may be provided. The extension element may be mechanically coupled to the connection element and may extend in a direction out of the mounting plane, wherein the extension element is configured for air cooling.

The method of FIG. 8 may include further acts. In one example, providing the extension element may include bending a diepad of a leadframe in the direction out of the mounting plane. In a further example, providing the extension element may include bending a lead of a leadframe in the direction out of the mounting plane. In yet a further example, providing the extension element may include soldering the extension element to the connection element.

EXAMPLES

In the following, semiconductor devices including an extension element for air cooling and methods for manufacturing thereof will be explained by means of examples.

Example 1 is a semiconductor device, comprising: a semiconductor chip; a connection element configured to mechanically and electrically couple the semiconductor device to a circuit board, wherein the connection element is electrically coupled to the semiconductor chip and arranged in a mounting plane of the semiconductor device, and wherein the semiconductor chip is mounted on the connection element; and an extension element mechanically coupled to the connection element and extending in a direction out of the mounting plane, wherein the extension element is configured for air cooling.

Example 2 is a semiconductor device according to Example 1, further comprising: a leadframe, wherein the semiconductor chip is mounted on the leadframe and the connection element is part of the leadframe.

Example 3 is a semiconductor device according to Example 2, wherein the connection element and the extension element are formed by a bent diepad of the leadframe.

Example 4 is a semiconductor device according to Example 2, wherein the connection element and the extension element are formed by a bent lead of the leadframe.

Example 5 is a semiconductor device according to one of the preceding Examples, wherein the connection element and the extension element are formed as an integral single piece.

Example 6 is a semiconductor device according to one of Examples 1 to 4, wherein the extension element is soldered to the connection element.

Example 7 is a semiconductor device according to one of the preceding Examples, wherein the extension element comprises multiple fingers arranged in a comb-shape.

Example 8 is a semiconductor device according to one of the preceding Examples, wherein the extension element tapers in a direction towards the connection element.

Example 9 is a semiconductor device according to one of the preceding Examples, wherein a surface of the extension element is in direct contact with air or an ambient gas.

Example 10 is a semiconductor device according to one of the preceding Examples, wherein a length of the extension element is smaller than 8 mm.

Example 11 is a semiconductor device according to one of the preceding Examples, wherein an angle between the extension element and the mounting plane is greater than 20 degrees.

Example 12 is a semiconductor device according to one of the preceding Examples, wherein the extension element extends in a direction substantially perpendicular to the mounting plane.

Example 13 is a semiconductor device according to one of the preceding Examples, wherein the extension element is made of one or more of a metal or a metal alloy.

Example 14 is a semiconductor device according to one of the preceding Examples, wherein the semiconductor chip comprises a transistor and the connection element is electrically coupled to a drain contact of the transistor.

Example 15 is a semiconductor device according to one of the preceding Examples, wherein the semiconductor device is a surface mounted device.

Example 16 is a semiconductor device according to one of the preceding Examples, wherein the semiconductor chip comprises a power semiconductor.

Example 17 is a method for manufacturing a semiconductor device, wherein the method comprises: providing a semiconductor chip; providing a connection element configured to mechanically and electrically couple the semiconductor device to a circuit board, wherein the connection element is electrically coupled to the semiconductor chip and arranged in a mounting plane of the semiconductor device, and wherein the semiconductor chip is mounted on the connection element; and providing an extension element mechanically coupled to the connection element and extending in a direction out of the mounting plane, wherein the extension element is configured for air cooling.

Example 18 is a method according to Example 17, wherein providing the extension element comprises bending a diepad of a leadframe in the direction out of the mounting plane.

Example 19 is a method according to Example 17, wherein providing the extension element comprises bending a lead of a leadframe in the direction out of the mounting plane.

Example 20 is a method according to Example 17, wherein providing the extension element comprises soldering the extension element to the connection element.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A semiconductor device, comprising:
    a semiconductor chip;
    a connecting element that is configured to mechanically and electrically couple the semiconductor device to a printed circuit board, wherein the connecting element is electrically coupled to the semiconductor chip and arranged in a mounting plane of the semiconductor device, and wherein the semiconductor chip is mounted on the connecting element;
    an extension element that is mechanically coupled to the connecting element and extends in a direction out of the mounting plane, wherein the extension element is configured for air cooling; and
    a leadframe, wherein the semiconductor chip is mounted on the leadframe and the connecting element is part of the leadframe,
    wherein the connecting element and the extension element are formed by a bent die pad of the leadframe or by a bent connection conductor of the leadframe
    wherein a lower surface of the connecting element extends along the mounting plane,
    wherein an upper surface of the connecting element is opposite from the lower surface of the connecting element and parallel to the mounting plane, and
    wherein the semiconductor chip is mounted on the upper surface of the connecting element,
    wherein the connecting element and the extension element are in the form of an integral single component.

2. The semiconductor device as claimed in claim 1, wherein the extension element comprises a plurality of fingers that are arranged in a comb shape.

3. The semiconductor device as claimed in claim 1, wherein the extension element tapers in a direction of the connecting element.

4. The semiconductor device as claimed in claim 1, wherein a surface of the extension element is in direct contact with air or an ambient gas.

5. The semiconductor device as claimed in claim 1, wherein a length of the extension element is less than 8 mm.

6. The semiconductor device as claimed in claim 1, wherein an angle between the extension element and the mounting plane is greater than 20 degrees.

7. The semiconductor device as claimed in claim 1, wherein the extension element extends in a direction perpendicular to the mounting plane.

8. The semiconductor device as claimed in claim 1, wherein the extension element is produced from one or more of a metal and a metal alloy.

9. The semiconductor device as claimed in claim 1, wherein the semiconductor chip comprises a transistor and the connecting element is electrically coupled to a drain contact of the transistor.

10. The semiconductor device as claimed in claim 1, wherein the semiconductor chip comprises a power semiconductor.

11. The semiconductor device as claimed in claim 1, wherein the leadframe further comprises a lead that is spaced apart from the connecting element and is electrically connected to a terminal of the semiconductor chip by a connection element, wherein the lead comprises a lower surface that extends along the mounting plane.

12. The semiconductor device as claimed in claim 1, wherein the semiconductor chip comprises a lower surface contact disposed on a bottom surface of the semiconductor chip, and wherein the bottom surface of the semiconductor chip is mounted on the upper surface of the connecting element such that the lower surface contact faces and electrically connects to the connecting element.

13. A method for producing a semiconductor device, wherein the method comprises:
    providing a semiconductor chip;
    providing a connecting element that is configured to mechanically and electrically couple the semiconductor device to a printed circuit board, wherein the connecting element is electrically coupled to the semiconductor chip and arranged in a mounting plane of the semiconductor device, and wherein the semiconductor chip is mounted on the connecting element; and
    providing an extension element that is mechanically coupled to the connecting element and extends in a direction out of the mounting plane, wherein the extension element is configured for air cooling,
    wherein providing the extension element comprises bending a die pad of a leadframe in the direction out of the mounting plane or bending a connection conductor of a leadframe in the direction out of the mounting plane, and
    wherein a lower surface of the connecting element extends along the mounting plane,
    wherein an upper surface of the connecting element is opposite from the lower surface of the connecting element and parallel to the mounting plane, and
    wherein the semiconductor chip is mounted on the upper surface of the connecting element,
    wherein the connecting element and the extension element are in the form of an integral single component.

14. The method as claimed in claim 13, wherein the leadframe further comprises a lead that is spaced apart from the connecting element and comprises a lower surface that extends along the mounting plane, and wherein the method further comprises electrically connecting the lead to a terminal of the semiconductor chip by a connection element.

15. The method as claimed in claim 13, wherein the semiconductor chip comprises a lower surface contact disposed on a bottom surface of the semiconductor chip, and wherein the method further comprises mounting the semiconductor chip such that the bottom surface of the semiconductor chip is mounted on the upper surface of the connecting element such and the lower surface contact faces and electrically connects to the connecting element.

* * * * *